(12) United States Patent
Su et al.

(10) Patent No.: US 9,660,529 B2
(45) Date of Patent: May 23, 2017

(54) TRANSISTOR CIRCUIT OF LOW SHUTOFF-STATE CURRENT

(71) Applicant: SMARTER MICROELECTRONICS (GUANG ZHOU) CO., LTD., Guangzhou (CN)

(72) Inventors: Qiang Su, Guangzhou (CN); Jiangtao Yi, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 44 days.

(21) Appl. No.: 14/735,820

(22) Filed: Jun. 10, 2015

(65) Prior Publication Data
US 2015/0280570 A1    Oct. 1, 2015

Related U.S. Application Data

(63) Continuation of application No. PCT/CN2013/086160, filed on Oct. 29, 2013.

(30) Foreign Application Priority Data

Dec. 13, 2012    (CN) .......................... 2012 1 0548838

(51) Int. Cl.
*H02M 3/158*    (2006.01)
*H03K 17/10*    (2006.01)
*H03K 17/06*    (2006.01)

(52) U.S. Cl.
CPC .......... *H02M 3/158* (2013.01); *H03K 17/063* (2013.01); *H03K 17/102* (2013.01); *H03K 2017/066* (2013.01); *H03K 2217/0018* (2013.01)

(58) Field of Classification Search
CPC .... G05F 1/40; G05F 1/44; G05F 1/59; H02M 3/158
USPC .......................... 323/265, 268, 171, 273, 271
See application file for complete search history.

(56) References Cited

U.S. PATENT DOCUMENTS

| | | | | |
|---|---|---|---|---|
| 6,236,594 | B1* | 5/2001 | Kwon | G11C 16/08 365/185.11 |
| 8,385,115 | B2* | 2/2013 | Lee | G11C 16/0483 365/185.02 |
| 9,240,239 | B2* | 1/2016 | Kang | G11C 16/0483 |
| 9,401,210 | B2* | 7/2016 | Kwon | G11C 16/10 |
| 2002/0118569 | A1* | 8/2002 | Jeong | G11C 16/10 365/185.18 |

\* cited by examiner

*Primary Examiner* — Adolf Berhane
(74) *Attorney, Agent, or Firm* — Syncoda LLC; Feng Ma; Junjie Feng

(57) ABSTRACT

A transistor circuit of low shutoff-state current includes: a first transistor, a transistor string, and a switch. The first transistor and the transistor string are connected in series. The switch is configured to shut off the circuit. The first transistor is configured to reduce the shutoff-state current flowing therethrough using the negative feedback effect of the transistor string when the circuit is in a shutoff state; and the transistor string is configured to reduce the shutoff-state current flowing therethrough using a negative gate-source electrode voltage difference thereof and the bulk effect of the transistor.

17 Claims, 6 Drawing Sheets

TRANSISTOR CIRCUIT OF LOW SHUTOFF-STATE CURRENT

CROSS-REFERENCE TO RELATED APPLICATIONS

The present application is a continuation of, and claims priority to, PCT/CN2013/086160 filed on Oct. 29, 2013, which claims priority to Chinese Patent Application No. 201210548838.5 filed on Dec. 13, 2012. The disclosures of the above applications are hereby incorporated by reference in their entirety.

BACKGROUND

With the rapid development of integrated circuit technology, the characteristic dimension of integrated circuits decreases rapidly, which brings many advantages, such as increasing level of integration of integrated circuits, reducing circuit delay and reducing the cost of integrated circuits, etc., but it also brings some problems. A relatively common problem is: When the characteristic dimension of integrated circuits decreases, the threshold voltage of the transistor in it decreases, thus, when the voltage difference between the gate electrode and the source electrode of the transistor is 0 and the transistor is in the shut-off state, the shutoff-state current of the transistor increases.

Low-power integrated circuit is a rapid developing area in integrated circuit field in recent years, particularly in practical applications such as industrial control and medical field, low-power integrated circuits has broad prospects for development. Low-power integrated circuits requires the shutoff-state current of transistors is very small, so as not to affect its standby time which can be several months or even several years. And after the characteristic dimension of integrated circuit decreases, the increase of shutoff-state current of the transistor and requirements of low-power integrated circuit were in conflict with each other.

In general, by increasing the channel length of the transistor L, the shutoff-state current of the transistor can be reduced. A conventional transistor shutoff-state circuit is shown in FIG. 1, when the switch S1 is turned on, the gate electrode and the source electrode of the N-type metal-oxide-semiconductor (NMOS) transistor N1 short-circuited, the voltage difference between the gate electrode and the source electrode of the NMOS transistor N1 is 0, at this moment, the NMOS transistor N1 is in the shut-off state; by increasing the channel length L of the NMOS transistor N1, the drift length of charge carriers in the channel area can be increased, thereby reduces the shutoff-state current of NMOS transistor N1. However, increasing the channel length L of the NMOS transistor N1 is bound to cause the increase in transistor size, which further causes increase in the overall size of the integrated circuit and increase of the cost of the integrated circuit chip.

SUMMARY

In order to solve the problems in existing technologies, the embodiments of the present disclosure provide a transistor circuit of low shut-off state current.

In order to achieve the above functions, the present disclosure adopts the following technical solutions.

The embodiments of the present disclosure provide a transistor circuit of low shut-off state current comprising: a first transistor, a transistor string and a switch; wherein, the first transistor is connected to the transistor string in series. The switch, is configured as turning off the circuit; The first transistor, is configured as using the negative feedback function of the transistor string to reduce the shut-off state current when the circuit is in shut-off state; The transistor string, is configured as using its voltage difference between the gate electrode and the source electrode and the body effect of the transistor to reduce the shut-off state current flowing through itself.

In the above-described embodiment, the gate electrode of the first transistor is connected to the gate electrode of the transistor string, the source electrode of the first transistor, the body region of the first transistor and the body region of the transistor string are connected to the common terminal, the drain electrode of the first transistor is connected to the source electrode of the transistor string, one end of the switch is connected to the gate electrode of the first transistor, the other end of the switch is connected to the common terminal, the switch is controlled by the switch control end; wherein, the gate electrode of the first transistor, the drain electrode of the transistor string and the switch control end are the connection points of this circuit and external circuits, the common terminal is power supply or ground line.

In the above-described embodiment, the first transistor is implemented by NMOS transistor, or, the first transistor is implemented by PMOS transistor.

In the above-described embodiment, when the first transistor is implemented by NMOS transistors, the common terminal is ground line, when the first transistor is implemented by PMOS transistor, the common terminal is power supply.

In above-described embodiment, the transistor string is composed of NMOS transistors, or, the transistor string is composed of PMOS transistors.

In the above-described embodiment, when the first transistor is implemented by NMOS transistor, the transistor string is composed of NMOS transistors; when the first transistor is implemented by PMOS transistor, the transistor string is composed of PMOS transistors.

In the above-described embodiment, the number of transistors in the transistor string is one or more than one.

In the above-described embodiment, the gate electrodes of all transistors in the transistor string are connected together, the body regions of all transistors in the transistor string are connected together, the drain electrode of the transistor in the transistor string that is connected to the drain electrode of the first transistor is connected to the source electrode of neighboring transistor, the drain electrode of the neighboring transistor of the transistor that is connected to the source electrode of the first transistor is connected to the source electrode of its neighboring transistor, so on and so forth, until the drain electrode of a transistor in the transistor string is connected to the source electrode of the transistor in the transistor string that is connected to the connection point.

In the above-described embodiment, the switch is implemented by NMOS transistor, or, the switch is implemented by PMOS transistor.

In the above-described embodiment, when the first transistor is implemented by NMOS transistor, the switch is implemented by NMOS transistor; when the first transistor is implemented by PMOS transistor, the switch is implemented by PMOS transistor.

In above-described embodiment, when the switch is implemented by NMOS transistor, the switch is turned on when the control end of switch is at high electrical level, the switch is turned off when the control end of the switch is at low electrical level; when the switch is implemented by PMOS transistor, the switch is turned off when the control end of the switch is at high electrical level, the switch is turned on when the control end of the switch is at low electrical level.

The transistor circuit of low shut-off state current provided by the embodiments of the present disclosure, when the transistor circuit of low shut-off current is turned off, the negative feedback effect of the transistor string reduces the shut-off state current flowing through the first transistor, the native voltage difference between the gate electrode and the source electrode of the transistor string and the body effect of the transistors in the transistor string reduce the shut-off state current flowing through the transistor string, thus, the shut-off current flowing through the first transistor and the shut-off state current flowing through the transistor string can be reduced effectively, thus the shut-off state current IOFF of the entire circuit is reduced effectively.

DETAILED DESCRIPTION

Figure 2:
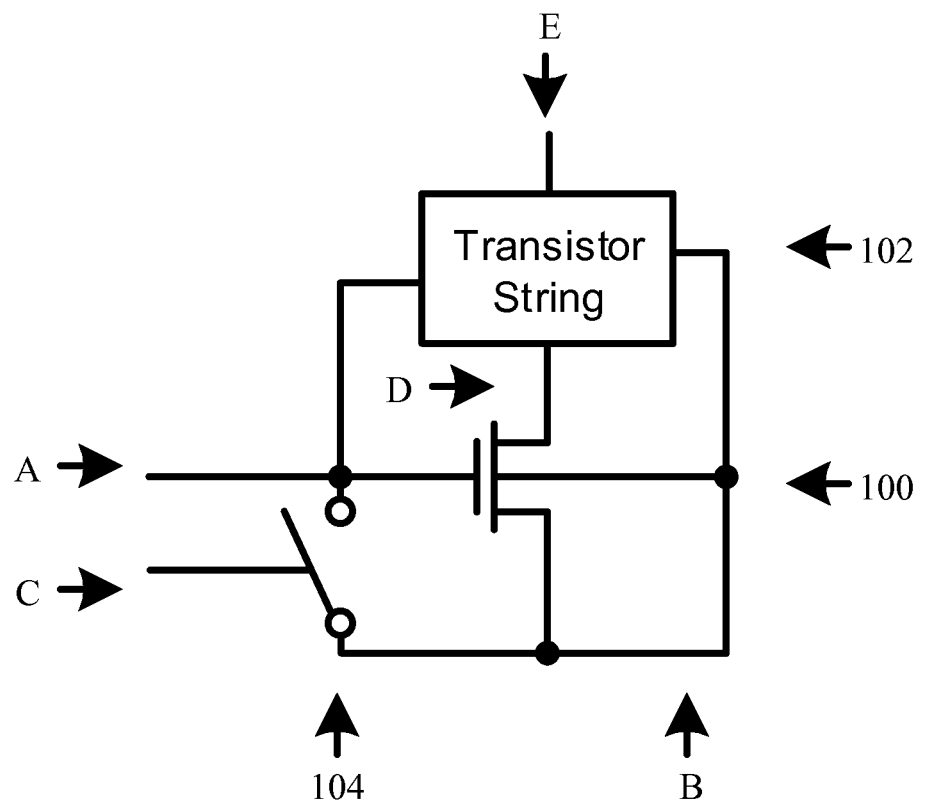
FIG. 2 is a diagram of a transistor circuit of low shut-off current of an embodiment of present disclosure.

The transistor circuit of low shut-off state current of the embodiment of the present disclosure, as shown in FIG. 2, comprises: A first transistor 100, a transistor string 102 and a switch 104; wherein, the first transistor is connected to the transistor string in series;

When the switch 104 turns off the transistor circuit of low shut-off state current, i.e., when the transistor circuit of low shut-off state current is in shut-off state, the negative feedback effect of transistor string 102 reduces the shut-off state current flowing through the first transistor 100, the negative voltage difference between the gate electrode and the source electrode of the transistor string 102 and the body effect of the transistors of transistor string 102 reduce the shut-off state current flowing through the transistor string 102, thus achieve the purpose of low shut-off state current.

The connection relationship of each components of the transistor circuit of low shut-off state current as show in FIG. 2 is:

The gate electrode of the first transistor is connected to the first node A, the source electrode and the body region of the first transistor 100 is connected to the second node B, the drain electrode of the first transistor 100 is connection to the fourth node D; the gate electrode of the transistor string 102 is connected to the first node A, the source electrode of the transistor string 102 is connected to the fourth node D, the drain electrode of transistor string 102 is connected to the fifth node E; one end of the switch 104 is connected to the fifth node A, the other end of the switch 104 is connected to the second node B, the switch control end of switch 104 is the third node C; Here, the first node A, the third node C, the fifth node E are the connection points of this circuit and other circuits of this embodiment; the fourth node D is the connection node inside the circuit of this embodiment; the second node B is connected to the common terminal, the common terminal may be power supply VDD, or may be ground line.

Figure 1:
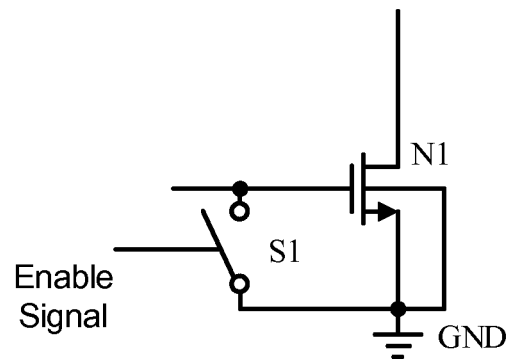
FIG. 1 is a diagram of a conventional transistor shut-off state circuit.

The working principles of the transistor circuit of low shut-off state current as shown in FIG. 1 is as follows:

When the circuit is in shut-off state, the shut-off current IOFF flows through the first transistor 100, causes the voltage difference between the drain electrode and the source electrode of the first transistor to increase, however, because the drain electrode of the first transistor is connected to the source electrode of the transistor string 102, because of the negative feedback effect, the range of increase of the voltage of the drain electrode of the first transistor is limited, i.e., the range of increase of the voltage difference between the drain electrode and the source electrode is limited, thus reduces the shut-off state current flowing through the first transistor 100. On the other hand, the increase of the voltage of the drain electrode of the first transistor 100, causes the voltage difference between the gate electrode and the source electrode of transistor string 102 to become negative, thus reduces the shut-off state current flowing through transistor string 102; at the same time, the voltage difference between the body region and source electrode of the transistor string 102 also becomes negative, and the body effect of the transistor will increase the threshold value voltage of each transistor in transistor string 102, thus reduces the shut-off state current flowing through the transistor string 102, thus reduces the shut-off state current IOFF of the entire circuit.

Figure 3A:
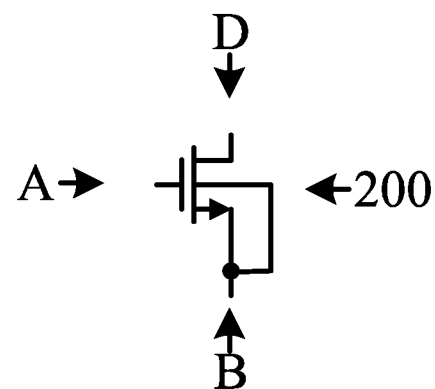
FIG. 3A is a structural diagram of an implement method of a first transistor of an embodiment of present disclosure.

In an embodiment, as shown in FIG. 3A, the first transistor 100 may be implemented by a ninth NMOS transistor 200. In this case, the second node B is connected to the ground line.

Figure 3B:
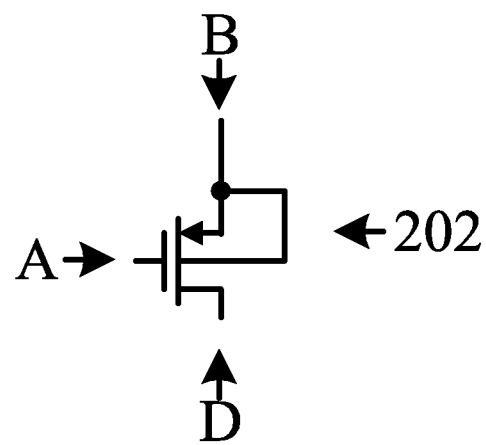
FIG. 3B is a structural diagram of another implement method of a first transistor of an embodiment of present disclosure.

In an embodiment, as shown in FIG. 3B, the first transistor 100 may be implemented by a ninth P-type metal-oxide-semiconductor (PMOS) transistor 202. In this case, the second node B is connected to power supply VDD.

Figure 4A:
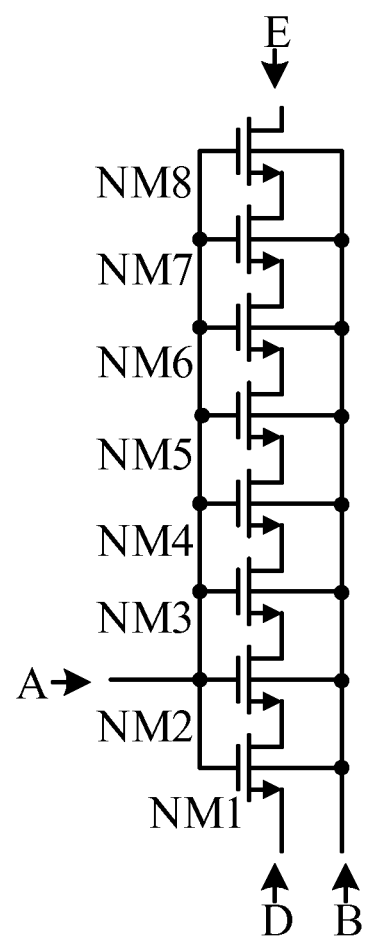
FIG. 4A is a structural diagram of another implement method of a transistor string of an embodiment of present disclosure.

In an embodiment, the transistor string may be composed of several NMOS transistors, as shown in FIG. 4, the transistor string may comprises: A first NMOS transistor NM1, a second NMOS transistor NM2, a third NMOS transistor NM3, a fourth NMOS transistor NM4, a fifth NMOS transistor NM5, a sixth NMOS transistor NM6, a seventh NMOS transistor NM7 and a eighth NMOS transistor NM8; wherein, the gate electrodes of each of the first NMOS transistor NM1, the second NMOS transistor NM2, the third NMOS transistor NM3, the fourth NMOS transistor NM4, the fifth NMOS transistor NM5, the sixth NMOS transistor NM6, the seventh NMOS transistor NM7 and the eighth NMOS transistor NM8 are connected together, the boy regions of each of the first NMOS transistor NM1, the second NMOS transistor NM2, the third NMOS transistor NM3, the fourth NMOS transistor NM4, the fifth NMOS transistor NM5, the sixth NMOS transistor NM6, the seventh NMOS transistor NM7 and the eighth NMOS transistor NM8 are connected together, the drain electrode of the first NMOS transistor NM1 is connected to the source electrode of the second NMOS transistor NM2, the drain electrode of the second NMOS transistor NM2 is connected to the source electrode of the third NMOS transistor NM3, the drain electrode of the third NMOS transistor NM3 is connected to the source electrode of the fourth NMOS transistor NM4, the drain electrode of the fifth NMOS transistor NM5 is connected to the source electrode of the sixth NMOS transistor NM6, the drain electrode of the sixth NMOS transistor NM6 is connected to the source electrode of the seventh NMOS transistor NM7, the drain electrode of the seventh NMOS transistor NM7 is connected to the source electrode of the eighth NMOS transistor NM8; the source electrode of the first NMOS transistor NM1 is the source electrode of the transistor string, the gate electrode of the first NMOS transistor NM1 is the gate electrode of the transistor string, the drain electrode of the eighth NMOS transistor is the drain electrode of the transistor string.

Figure 4B:
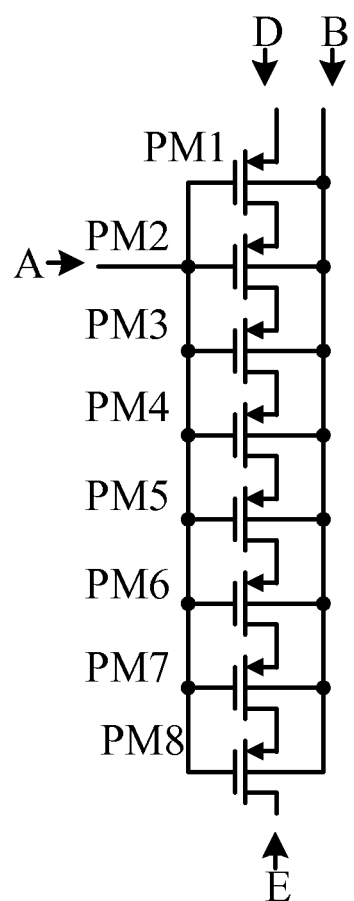
FIG. 4B is a structural diagram of another implement method of a transistor string of an embodiment of present disclosure.

In an embodiment, the transistor string may be composed of several PMOS transistors, as shown in FIG. 4B, the transistor string may include: A first PMOS transistor PM1, a second PMOS transistor PM2, a third PMOS transistor PM3, a fourth PMOS transistor PM4, a fifth PMOS transistor PM5, a sixth PMOS transistor PM6, a seventh PMOS transistor PM7 and a eighth PMOS transistor PM8; wherein, the gate electrodes of each of the first PMOS transistor PM1, the second PMOS transistor PM2, the third PMOS transistor PM3, the fourth PMOS transistor PM4, the fifth PMOS transistor PM5, the sixth PMOS transistor PM6, the seventh PMOS transistor PM7 and the eighth PMOS transistor PM8 are connected together, the boy regions of each of the first PMOS transistor PM1, the second PMOS transistor PM2, the third PMOS transistor PM3, the fourth PMOS transistor PM4, the fifth PMOS transistor PM5, the sixth PMOS transistor PM6, the seventh PMOS transistor PM7 and the eighth PMOS transistor PM8 are connected together, the drain electrode of the first PMOS transistor PM1 is connected to the source electrode of the second PMOS transistor PM2, the drain electrode of the second PMOS transistor PM2 is connected to the source electrode of the third PMOS transistor PM3, the drain electrode of the third PMOS transistor PM3 is connected to the source electrode of the fourth PMOS transistor PM4, the drain electrode of the fifth PMOS transistor PM5 is connected to the source electrode of the sixth PMOS transistor PM6, the drain electrode of the sixth PMOS transistor PM6 is connected to the source electrode of the seventh PMOS transistor PM7, the drain electrode of the seventh PMOS transistor PM7 is connected to the source electrode of the eighth PMOS transistor PM8; the source electrode of the first PMOS transistor PM1 is the source electrode of the transistor string, the gate electrode of the first PMOS transistor PM1 is the gate electrode of the transistor string, the drain electrode of the eighth PMOS transistor PM8 is the drain electrode of the transistor string.

In practical applications, the type of transistor in the transistor string is determined by the method of implementation of the first transistor, specifically, when the first transistor is implemented by NMOS transistor, the transistor string is composed of NMOS transistors; when the first transistor is implemented by PMOS transistor, the transistor string is composed of PMOS transistors, wherein, the number of transistors in the transistor string may be one or more than one, preferably, the number of transistors in the transistor string maybe be 1-8. The gate electrode of the transistor in the transistor string that is connected to the fourth node D is the gate electrode of the transistor string, the source electrode of the transistor in the transistor string that is connected to the fourth node D is the source electrode of the transistor string, the drain electrode of the transistor in the transistor string that is connected to the fifth node E is the drain electrode of the transistor string, the gate electrodes of all transistors in the transistor string are connected together, the body regions of all transistors in the transistor string are connected together, the drain electrode of the transistor in the transistor string that is connected to the fourth node D is connected to the source electrode of the neighboring transistor, the drain electrode of the transistor next to the transistor that is connected to the fourth node D is connected to the source electrode of its neighboring transistor, so on and so forth, until the drain electrode of a transistor in the transistor string is connected to the source electrode of the transistor in the transistor string that is connected to the fifth node E.

Figure 5A:
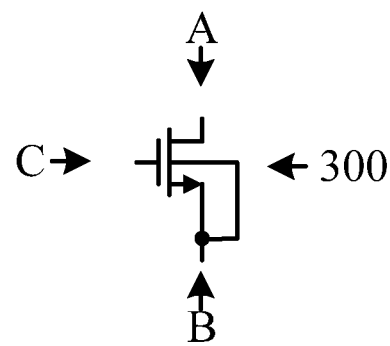
FIG. 5A is a structural diagram of an implement method of a switch of an embodiment of present disclosure.

In an embodiment, as shown in FIG. 5A, switch 104 may be implemented by tenth PMOS transistor 300. In this case, the switch is turned on when the control end of the switch is at high electrical level, the switch is turned off when the control end of the switch is at low electrical level.

Figure 5B:
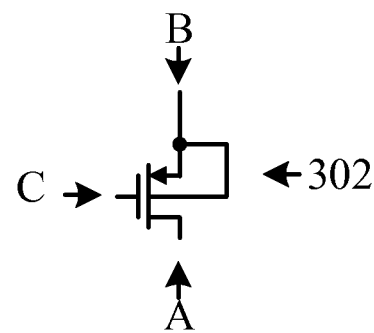
FIG. 5B is a structural diagram of another implement method of a switch of an embodiment of present disclosure.

In an embodiment, as shown in FIG. 5B, switch 104 may be implemented by tenth PMOS transistor 302. In this case, the switch is turned on when the control end of the switch is at low electrical level, the switch is turned off when the control end of the switch is at high electrical level.

In practical applications, the implementation method of the switch is determined by the implementation method of the first transistor, specifically, when the first transistor is implemented by NMOS transistor, the switch is implemented by the tenth NMOS transistor 300; when the first transistor is implemented by PMOS transistor, the switch is implemented by the tenth PMOS transistor 302.

The transistor circuit of low shut-off state current of the embodiments of the present disclosure, when the circuit is in shut-off state, the voltage difference between the gate electrode and the source electrode of the first transistor is 0, the shut-off state current IOFF flows through the first transistor and the transistor string, thus reduces the shut-off state current flowing through the first transistor and the shut-off state current flowing through the transistor string, thus reduces the shut-off state current IOFF of the entire circuit.

Assuming the total channel length of all transistors in the first transistor and the transistor string in transistor circuit of low shut-off state current of the embodiments of present disclosure is Ltot, the channel length of the NMOS transistor N1 of the conventional transistor shut-off state circuit as shown in FIG. 1 is L, even if Ltot and L is equal, i.e., the area is equal, compared with the conventional transistor shut-off state circuit as shown in FIG. 1, adopting the transistor circuit of low shut-off state current of the embodiments of the present disclosure, because the shut-off state current flowing through the first transistor and the transistor string is reduced, the shut-off current IOFF can still be reduced. From another perspective, under the condition of the same shut-off state current IOFF, compared with the conventional transistor shut-off state circuit as shown in FIG. 1, adopting the transistor circuit of low shut-off state current of the embodiments of the present disclosure, Ltot will be smaller than L.

When manufacturing the transistor circuit of low shut-off state current of the embodiments of the present disclosure, it does not rely on the type of manufacturing process, for example, it maybe be standard CMOS process, may be BiCMOS process, and may be Silicon-on-insulator (SOI) process etc.

Figure 6:
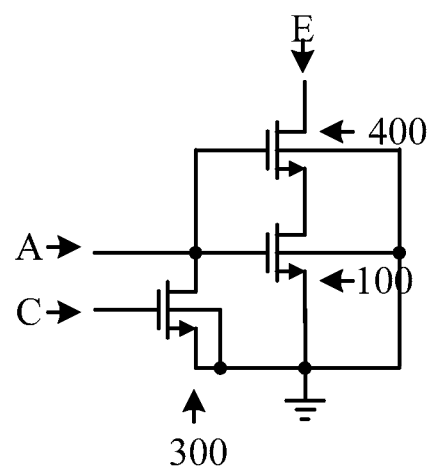
FIG. 6 is a structural diagram of a transistor circuit of low shut-off state current of embodiment 1 of present disclosure.

FIG. 6 is a structural diagram of the transistor circuit of low shut-off state current of embodiment 1 of the present disclosure. As shown in FIG. 1, the first transistor is implemented by the ninth NMOS transistor 200, the transistor string is implemented by the eleventh NMOS transistor 400, the switch is implemented by the tenth NMOS transistor 300; the source electrode and the body region of the ninth transistor and the body region of the eleventh NMOS transistor are connected to the ground. The total channel length of the first transistor 100 and the eleventh transistor 400 is Ltot, the channel length of the NMOS transistor N1 of the conventional transistor shut-off state circuit shown in FIG. 1 is L, even if Ltot and L is equal, i.e., the area is equal, compared with the conventional transistor shut-off state circuit shown in FIG. 1, adopting the transistor circuit of low shut-off state current of the embodiment of the present disclosure can still reduce shut-off current IOFF, from another perspective, under the condition of the same shut-off current IOFF, compared with the conventional transistor shut-off state circuit, adopting the transistor circuit of low shut-off state current of the embodiment of the present disclosure, the Ltot is smaller than L.

Figure 7:
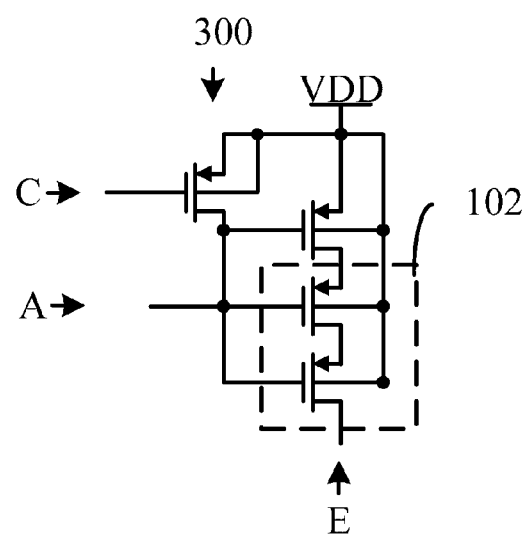
FIG. 7 is a structural diagram of a transistor circuit of low shut-off state current of embodiment 2 of present disclosure.

FIG. 7 is a structural diagram of the transistor circuit of low shut-off state current of embodiment 2 of the present disclosure. As shown in FIG. 7, in this embodiment, the first transistor is implemented by the ninth PMOS transistor 202, transistor string 102 is implemented by the eleventh PMOS transistor 500 and the twelfth PMOS transistor 502, the switch 104 is implemented by the tenth PMOS transistor 302; the source electrode and the body region of the ninth PMOS transistor 202, the body region of the eleventh PMOS transistor 500 and the body region of the twelfth transistor 502 are connected to power supply VDD; the drain electrode of the eleventh PMOS transistor 500 is connected to the source electrode of the twelfth PMOS transistor 502, the total channel length of the twelfth PMOS transistor 202, the eleventh PMOS transistor 500 and the twelfth PMOS transistor is Ltot, the channel length of the NMOS transistor N1 of the conventional transistor shut-off state circuit shown in FIG. 1 is L, even if Ltot and L is equal, i.e., the area is equal, compared with the conventional transistor shut-off state circuit shown in FIG. 1, adopting the transistor circuit of low shut-off state current of the embodiment of the present disclosure can still reduce shut-off current IOFF, from another perspective, under the condition of the same shut-off current IOFF, compared with the conventional transistor shut-off state circuit, adopting the transistor circuit of low shut-off state current of the embodiment of the present disclosure, the Ltot is smaller than L.

The above-described embodiments are merely illustrations of the principles and effects of the present disclosure, and is not intended to limit the present disclosure. People skilled in the art can modify or change the above embodiments without departing from the spirit and scope of present disclosure. Thus, any modifications or changes made by people skilled in the art without departing from the spirit or technical ideas disclosed by this disclosure are still covered by the claims of the present disclosure.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A transistor circuit of low shutoff-state current comprising: a first transistor, a transistor string and a switch; wherein the first transistor is connected to the transistor string in series; wherein:
the switch is configured to turning off the transistor circuit;
the first transistor is configured to reduce a shut-off state current flowing therethrough using a negative feedback effect of the transistor string if the transistor circuit is in shut-off state;
the transistor string is configured to reduce a shut-off state current flowing therethrough using a negative voltage difference between a gate electrode and a source electrode and a transistor body effect; and
a gate electrode of the first transistor is connected to the gate electrode of the transistor string, a source electrode of the first transistor, a body region of the first transistor, and a body region of the transistor string are connected to a common terminal, a drain electrode of the first transistor is connected to the source electrode of the transistor string, one end of the switch is connected to the gate electrode of the first transistor, another end of the switch is connected to the common terminal, the switch is controlled by a switch control end; wherein, the gate electrode of the first transistor, the drain electrode of the transistor string, the switch control end comprise a connection node of the circuit and external circuits, the common terminal is a power supply or ground.

2. The transistor circuit of claim 1, wherein the first transistor is implemented using an NMOS transistor, or, the first transistor is implemented using a PMOS transistor.

3. The transistor circuit of claim 2, wherein if the first transistor is implemented using the NMOS transistor, the common terminal is ground; if the first transistor is implemented using the PMOS transistor, the common terminal is power supply.

4. The transistor circuit of claim 1, wherein the transistor string is composed of NMOS transistors, or the transistor string is composed of PMOS transistors.

5. The transistor circuit of claim 4, wherein if the first transistor is implemented using an NMOS transistor, the transistor string is composed of NMOS transistors; if the first transistor is implemented using a PMOS transistor, the transistor string is composed of PMOS transistors.

6. The transistor circuit of claim 4, wherein the transistor string comprises one or more transistors.

7. The transistor circuit of claim 6, wherein the gate electrodes of each transistor in the transistor string are connected together, the body regions of all transistors in the transistor string are connected together, the drain electrode of the transistor in the transistor string that is connected to the drain electrode of the first transistor is connected to the source electrode of the neighboring transistor, the drain electrode of the transistor next to the transistor that is connected to the source electrode of the first transistor is connected to the source electrode of the transistor neighboring it, so on and so forth, until the drain electrode of a transistor in the transistor string is connected to the source electrode of the transistor in the transistor string that is connected to the connection node.

8. The transistor circuit of claim 1, wherein the switch is implemented using an NMOS transistor, or the switch is implemented using a PMOS transistor.

9. The transistor circuit of claim 8, wherein if the first transistor is implemented using an NMOS transistor, the switch is implemented an NMOS transistor; if the first transistor is implemented using a PMOS transistor, the switch is implemented using a PMOS transistor.

10. The transistor circuit of claim 8, wherein if the switch is implemented using an NMOS transistor, the switch is turned on if the switch control end is at a high electrical level, the switch is turned off if the switch control end is at a low electrical level; if the switch is implemented using a PMOS transistor, the switch is turned off if the switch control end is at a high electrical level, the switch is turned on if the switch control end is at a low electrical level.

11. The transistor circuit of claim 1, wherein the transistor string comprises 1-8 transistors.

12. The transistor circuit of claim 1, wherein the body effect is configured to increase a threshold voltage of each transistor in the transistor string.

13. An integrated circuit comprising a transistor circuit of low shut-off state current including: a first transistor, a transistor string and a switch; wherein the first transistor is connected to the transistor string in series; wherein: the switch is configured to turning off the transistor circuit; the first transistor is configured to reduce a shut-off state current flowing there through using a negative feedback effect of the transistor string if the circuit is in shut-off state; the transistor string is configured to reduce a shut-off state current flowing there through using a negative voltage difference between a gate electrode and a source electrode and a transistor body effect, wherein a gate electrode of the first transistor is connected to the gate electrode of the transistor string, a source electrode of the first transistor, a body region of the first transistor, and a body region of the transistor string are connected to a common terminal, a drain electrode of the first transistor is connected to the source electrode of the transistor string, one end of the switch is connected to the gate electrode of the first transistor, another end of the switch is connected to the common terminal, the switch is controlled by a switch control end; wherein, the gate electrode of the first transistor, the drain electrode of the transistor string, the switch control end comprise a connection node of the circuit and external circuits, the common terminal is a power supply or ground.

14. The integrated circuit of claim 13, wherein the body effect is configured to increase a threshold voltage of each transistor in the transistor string.

15. The integrated circuit of claim 13, wherein the transistor string comprises 1-8 transistors.

16. A method of reducing a shutoff-state current of an integrated circuit, wherein the integrated circuit includes a transistor circuit of low shutoff-state current including: a first transistor, a transistor string and a switch; wherein the first transistor is connected to the transistor string in series; the method comprising:
disposing the switch to be capable of turning off the transistor circuit;
reducing a shut-off state current flowing through the first transistor using a negative feedback effect of the transistor string if the transistor circuit is in shut-off state; and
reducing a shut-off state current flowing through the transistor string using a negative voltage difference between a gate electrode and a source electrode and a transistor body effect;
wherein a gate electrode of the first transistor is connected to the gate electrode of the transistor string, a source electrode of the first transistor, a body region of the first transistor, and a body region of the transistor string are connected to a common terminal, a drain electrode of the first transistor is connected to the source electrode of the transistor string, one end of the switch is connected to the gate electrode of the first transistor, another end of the switch is connected to the common terminal, the switch is controlled by a switch control end; wherein, the gate electrode of the first transistor, the drain electrode of the transistor string, the switch control end comprise a connection node of the circuit and external circuits, the common terminal is a power supply or ground.

17. The method of claim 16, further comprising:
if the first transistor is implemented using an NMOS transistor, then configuring the common terminal as ground;
if the first transistor is implemented using a PMOS transistor, then configuring the common terminal as power supply.

* * * * *